United States Patent
Yu et al.

(10) Patent No.: US 10,516,405 B2
(45) Date of Patent: Dec. 24, 2019

(54) SEMICONDUCTOR DEVICES AND METHODS OF OPERATING THE SAME

(71) Applicant: Samsung Electronics Co., Ltd., Suwon-si, Gyeonggi-do (KR)

(72) Inventors: Won Sik Yu, Anyang-si (KR); Woo Seok Kim, Suwon-si (KR); Ji Hyun Kim, Hwaseong-si (KR); Tae Ik Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/027,646

(22) Filed: Jul. 5, 2018

(65) Prior Publication Data

US 2019/0214999 A1 Jul. 11, 2019

(30) Foreign Application Priority Data

Jan. 8, 2018 (KR) .......................... 10-2018-0002203

(51) Int. Cl.
*H03L 1/00* (2006.01)
*H03L 7/099* (2006.01)
(Continued)

(52) U.S. Cl.
CPC .......... *H03L 7/0991* (2013.01); *G04F 10/005* (2013.01); *H03L 7/093* (2013.01); *H03L 7/18* (2013.01)

(58) Field of Classification Search
CPC ......... H03L 7/0991; H03L 7/093; H03L 7/18; G04F 10/005
See application file for complete search history.

(56) References Cited

U.S. PATENT DOCUMENTS 7,466,207 B2 12/2008 Staszewski et al.
7,994,867 B2 8/2011 Kobayashi
(Continued)

FOREIGN PATENT DOCUMENTS

JP 4735632 B2 7/2011

OTHER PUBLICATIONS

Jaewook Shin et al., "A 1.9-3.8 GHz Δ Σ Fractional-N PLL Frequency Synthesizer With Fast Auto-Calibration of Loop Bandwidth and VCO Frequency", IEEE Journal of Solid-State Circuits, vol. 47, No. 3, Mar. 2012, pp. 665-675.
(Continued)

*Primary Examiner* — Dinh T Le
(74) *Attorney, Agent, or Firm* — Harness, Dickey & Pierce, P.L.C.

(57) ABSTRACT

A semiconductor device includes a time-to-digital converter (TDC) that receives a reference frequency signal and a feedback frequency signal, and outputs a first digital signal indicating a time difference between the reference frequency signal and the feedback frequency signal; a digital loop filter (DLF) that outputs a second digital signal generated by filtering the first digital signal; a multiplier circuit that outputs one of a third digital signal and a final test signal, the third digital signal generated by performing a multiplication operation on the second digital signal using a multiplication coefficient; a digital-controlled oscillator (DCO) that generates an oscillation signal having a frequency based on the output one of the third digital signal and the final test signal; and a loop gain calibrator (LGC) that receives the oscillation signal, generates a pair of test signals, and determines the multiplication coefficient using the pair of test signals.

16 Claims, 10 Drawing Sheets

(51) Int. Cl.
*H03L 7/18* (2006.01)
*H03L 7/093* (2006.01)
*G04F 10/00* (2006.01)

(56) References Cited

U.S. PATENT DOCUMENTS

| | | | |
|---|---|---|---|
| 8,008,956 B1 | 8/2011 | Shin et al. | |
| 8,432,199 B2 | 4/2013 | Lee et al. | |
| 8,487,708 B2* | 7/2013 | Hayashi | H03L 7/0996 |
| | | | 327/156 |
| 8,515,374 B2 | 8/2013 | Dan et al. | |
| 9,025,965 B2 | 5/2015 | Lee et al. | |
| 9,634,826 B1* | 4/2017 | Park | G04F 10/005 |
| 9,680,486 B2 | 6/2017 | Kuo et al. | |
| 10,340,928 B2* | 7/2019 | Mateman | H03L 7/0992 |

OTHER PUBLICATIONS

Taekwang Jang, et al, "A 2.5ps 0.8-to-3.2GHz Bang-Bang Phase- and Frequency-Detector-Based All-Digital PLL with Noise Self-Adjustment," pp. 148-150, Feb. 5-9, 2017, 2017 IEEE International Solid-State Circuits Conference, CA USA.

Mario Mercandelli, et al., "A Background Calibration Technique to Control the Bandwidth of Digital PLLs," pp. 1-13, Oct. 10, 2018, IEEE Journal of Solid-State Circuits.

\* cited by examiner

SEMICONDUCTOR DEVICES AND METHODS OF OPERATING THE SAME

This application claims priority to Korean Patent Application No. 10-2018-0002203, filed on Jan. 8, 2018, and all the benefits accruing therefrom under 35 U.S.C. § 119, the disclosure of which is incorporated herein by reference in its entirety.

BACKGROUND

1. Field

Some example embodiments relate to semiconductor devices and methods of operating the same, and more particularly, to semiconductor devices including a digital phase locked loop (DPLL) and methods of operating the semiconductor device.

2. Description of the Related Art

A digital phase locked loop (DPLL) receives a reference frequency signal and a feedback frequency signal, which is provided via a feedback loop, and generates an oscillation signal, which is set to the same desired frequency as a clock signal, by converting the received reference frequency signal and the feedback frequency signal such that the frequencies of the two signals can become same and the phase difference therebetween can become uniform.

The DPLL, unlike a phase locked loop (PLL), which is of an analog type, does not use elements such as a charge pump circuit, an analog low pass filter, and the like. Thus, the DPLL occupies a small space and can be operated with a low voltage.

However, the DPLL may be affected by process-voltage-temperature (PVT) variations. For example, a time-to-digital converter (TDC) or a digital-controlled oscillator (DCO) of the DPLL may be affected by PVT variations. Specifically, factors such as the resolution ($\Delta_{TDC}$) of the TDC and the gain ($K_{DCO}$) of the DCO may be affected by PVT variations and may thus change the loop gain of the DPLL. As a result, the loop bandwidth of the DPLL may not be able to be uniformly maintained.

SUMMARY

Some example embodiments provide semiconductor devices capable of providing a uniform loop gain and a uniform loop bandwidth by offsetting variations in the characteristics of a digital-controlled oscillator (DCO), resulting from process-voltage-temperature (PVT) variations.

Some example embodiments also provide methods of operating a semiconductor device capable of providing a uniform loop gain and a uniform loop bandwidth by offsetting variations in the characteristics of a DCO, resulting from PVT variations However, some example embodiments are not restricted to those set forth herein. Some example embodiments will become more apparent to one of ordinary skill in the art to which the present disclosure pertains by referencing the detailed description of the present disclosure given below.

According to some example embodiments, there is provided a semiconductor device including a time-to-digital converter (TDC) configured to receive a reference frequency signal and a feedback frequency signal, and output a first digital signal indicating a time difference between the reference frequency signal and the feedback frequency signal. The semiconductor device also includes a digital loop filter (DLF) configured to output a second digital signal generated by filtering the first digital signal. The semiconductor device also includes a multiplier circuit configured to output one of a third digital signal and a final test signal, the third digital signal being generated by performing a multiplication operation on the second digital signal using a multiplication coefficient. The semiconductor device also includes a digital-controlled oscillator (DCO) configured to generate an oscillation signal having an oscillation signal frequency based on the output one of the third digital signal and the final test signal. The semiconductor device also includes a loop gain calibrator (LGC) configured to receive the oscillation signal, generate a pair of test signals, and determine the multiplication coefficient using the pair of test signals.

According to some example embodiments, there is provided a semiconductor device including a time-to-digital converter (TDC) configured to receive a reference frequency signal and a feedback frequency signal, and output a first digital signal indicating a time difference between the reference frequency signal and the feedback frequency signal. The semiconductor device also includes a digital loop filter (DLF) configured to output a second digital signal generated by filtering the first digital signal. The semiconductor device also includes a multiplier circuit including a multiplier configured to generate a third digital signal by performing a multiplication operation on the second digital signal using a multiplication coefficient, and a multiplexer configured to selectively output one of the third digital signal and a final test signal to a digital-controlled oscillator (DCO). The DCO is configured to generate an oscillation signal having an oscillation signal frequency based on the output one of the third digital signal and the final test signal. The semiconductor device also includes an loop gain calibrator (LGC) configured to receive the oscillation signal, generate a pair of test signals, and generate the final test signal using the pair of test signals.

According to some example embodiments, there is provided a method of operating a semiconductor device including generating a first output signal by performing a first calibration operation on an oscillation signal of a digital-controlled oscillator (DCO), the oscillation signal having an oscillation signal frequency. The method also includes generating a first test signal, a frequency of the first test signal being lower than a frequency of the first output signal by as much as a first frequency. The method also includes generating a second test signal, a frequency of the second test signal being higher than the frequency of the first output signal by as much as the first frequency. The method also includes generating a final test signal based on the first and second test signals. The method also includes performing a second calibration on the oscillation signal frequency by providing the final test signal to the DCO.

Some example embodiments and features of the present disclosure may be apparent from the following detailed description, the drawings, and the claims.

BRIEF DESCRIPTION OF THE DRAWINGS

Some example embodiments and features of the present disclosure will become more apparent by describing in detail some example embodiments thereof with reference to the attached drawings, in which.

DETAILED DESCRIPTION

Figure 1:
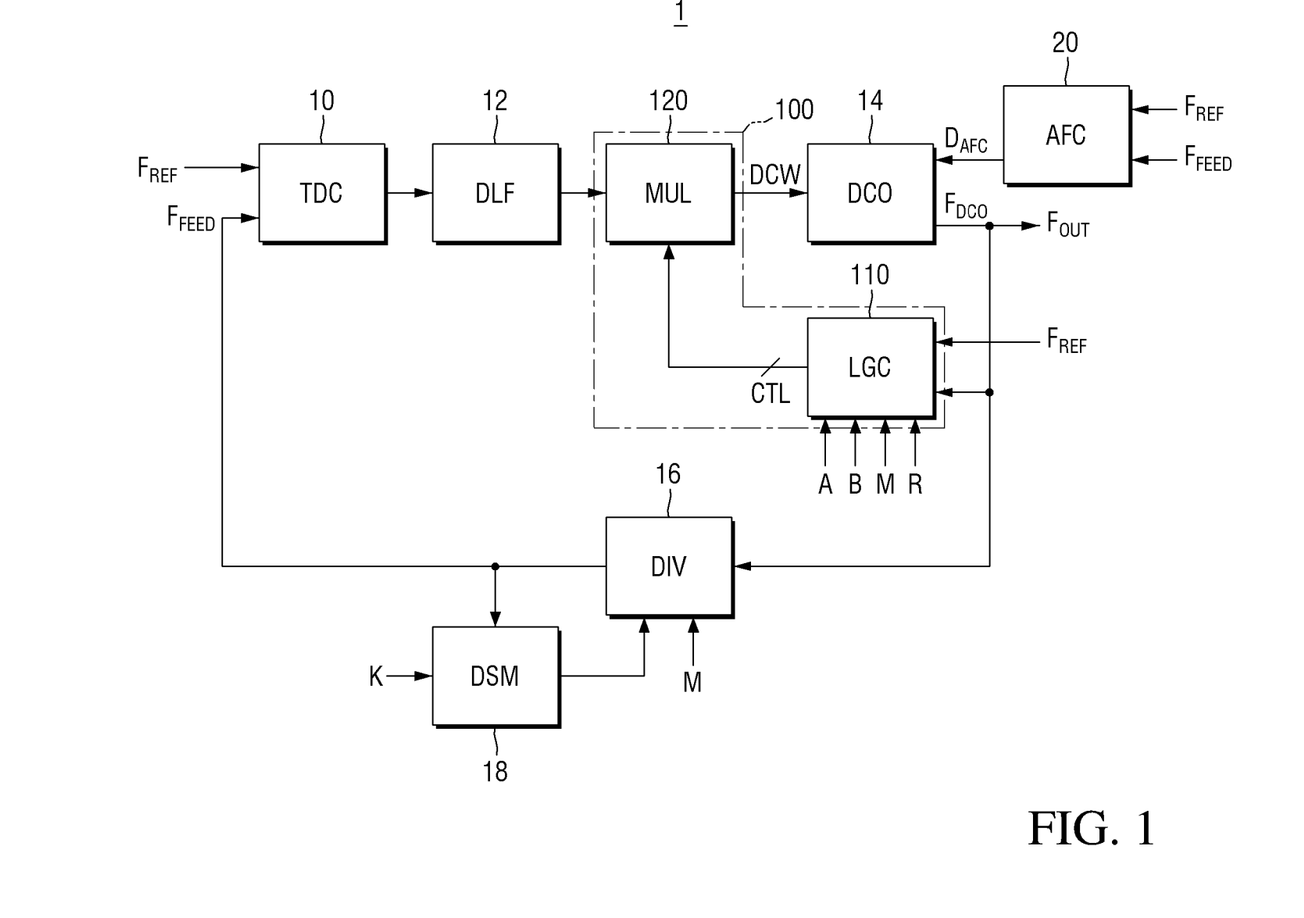
FIG. 1 is a block diagram of a semiconductor device according to some example embodiments.

FIG. 1 is a block diagram of a semiconductor device according to some example embodiments.

Referring to FIG. 1, a semiconductor device 1 includes a time-to-digital converter (TDC) 10, a digital loop filter (DLF) 12, a digital-controlled oscillator (DCO) 14, a first divider circuit (DIV) 16, and a second divider circuit (DSM) 18. According to some example embodiments, operations described herein as being performed by any or all of the TDC 10, the DLF 12, the DCO 14, the first divider circuit 16 and the second divider circuit 18 may be performed by circuitry, such as an application-specific integrated circuit (ASIC) and/or a field programmable gate array (FPGA).

The TDC 10 receives a reference frequency signal $F_{REF}$ and a feedback frequency signal $F_{FEED}$ and outputs the time difference between the reference frequency signal $F_{REF}$ and the feedback frequency signal $F_{FEED}$ as a first digital signal. That is, the TDC 10 may compare the phases and frequencies of the reference frequency signal $F_{REF}$ and the feedback frequency signal $F_{FEED}$ and output a digital signal that is based on the phase and frequency differences between the reference frequency signal $F_{REF}$ and the feedback frequency signal $F_{FEED}$ as the first digital signal. According to some example embodiments, the TDC may receive the reference frequency signal $F_{REF}$ via software such as an operating system or an application or via hardware such as a memory or a register.

A resolution $\Delta_{TDC}$ of the TDC 10 may be affected by process-voltage-temperature (PVT) variations, and as a result, the characteristics of the TDC 10 may change.

The DLF 12 may output a second digital signal by performing a filtering operation on the first digital signal output by the TDC 10. That is, the DLF 12 may perform a low band-pass filtering operation on the first digital signal, which is output by the TDC 10 and represents the phase and frequency differences between the reference frequency signal $F_{REF}$ and the feedback frequency signal $F_{FEED}$, and outputs the result of the low band-pass filtering operation as the second digital signal.

The DLF 12 is generally realized as an element such as a digital adder or a digital multiplier and is thus not substantively affected by PVT variations.

The DCO 14 may generate an oscillation signal $F_{DCO}$ having a determined frequency based on a third digital signal DCW output by a multiplier circuit 120 of a calibration circuit 100. The multiplier circuit 120 may perform a multiplication operation on the second digital signal, which is output by the DLF 12, using a determined multiplication coefficient β. That is, the DCO 14 may generate the oscillation signal $F_{DCO}$ based on the third digital signal DCW, which is based on the second digital signal output from the DLF 12 that is passed through the multiplier circuit 120.

A gain $K_{DCO}$ of the DCO 14 may be affected by PVT variations, and as a result, the characteristics of the DCO 14 may change.

The first divider circuit 16 may generate the feedback frequency signal $F_{FEED}$ by dividing the oscillation signal $K_{DCO}$, which is output by the DCO 14, by a first division ratio M and may feed back the feedback frequency signal $F_{FEED}$ to the TDC 10. Accordingly, the TDC 10 may repeatedly compare the phases and frequencies of the reference frequency signal $F_{REF}$ and the feedback frequency signal $F_{FEED}$. According to some example embodiments, the first divider circuit 16 may receive the first division ratio M via software such as an operating system or an application or via hardware such as a memory or a register.

The second divider circuit 18 may allow, together with the first divider circuit 16, the frequency of the feedback frequency signal $F_{FEED}$ to be precisely adjusted with a second division ratio K. For example, in order to obtain a rational frequency value a, rather than an integer frequency value M, the second divider circuit 18 may dither the first division ratio M, thereby obtaining a rational division ratio (M+α). Here, α=K/2n where n is the number of bits of the second division ratio K.

The first and second divider circuits 16 and 18 may be selectively employed or unemployed depending on an application of the semiconductor device 1 and are not considerably affected by PVT variations.

If the calibration circuit 100 is not provided in the semiconductor device 1, a loop gain T(s) of the semiconductor device 1, which is modeled from an s-domain, may be determined by the following equation:

$$T(s) = \frac{1}{2\pi} \cdot \frac{T_{REF}}{\Delta_{TDC}} \cdot \frac{K_{DCO}}{s} \cdot \frac{1}{M+\alpha} \cdot H_{DLF}(s)$$

where $T_{REF}$ denotes the period of the reference frequency signal, $\Delta_{TDC}$ denotes the resolution of the TDC 10, $K_{DCO}$ denotes the gain of the DCO 14, M+a denotes a coefficient used by the first and second divider circuits 16 and 18 to determine the oscillation signal $F_{DCO}$, and $H_{DLF}(s)$ denotes the characteristic equation of the DLF 12.

As shown in the above equation, as the resolution $\Delta_{TDC}$ of the TDC 10 and the gain $K_{DCO}$ of the DCO 14 are affected by PVT variations, not only the characteristics of the TDC 10 and the DCO 14, but also the loop gain of the entire semiconductor device 1, may change. Accordingly, the loop bandwidth of the semiconductor device 1 may not be able to be uniformly maintained, and as a result, the yield of the semiconductor device 1 may be lowered.

In order to address these challenges, the semiconductor device 1 may further include the calibration circuit 100.

The calibration circuit 100 includes a loop gain calibrator (LGC) 110 and the multiplier circuit 120.

The LGC 110 is a circuit for compensating for the influence of PVT variations on the DCO 14. That is, when the gain $K_{DCO}$ of the DCO 14 decreases due to PVT variations, the LGC 110 uniformly maintains loop gain by compensating for the decrease in the gain $K_{DCO}$ of the DCO 14 using the multiplier circuit 120.

Specifically, the LGC 110 receives the oscillation signal $F_{DCO}$, generates a pair of test signals (D1 and D2), and determines the multiplication coefficient β of the multiplier circuit 120 using the pair of test signals (D1 and D2) and the first division ratio M. Also, the LGC 110 generates a final test signal $D_{TEST}$, which may be input to the DCO 14 in place of the third digital signal DCW, using the pair of test signals (D1 and D2). For example, the LGC 110 may generate the final test signal $D_{TEST}$ by performing a subtraction operation using the pair of test signals (D1 and D2). According to some example embodiments, the LGC 110 may receive the first division ratio M and the reference frequency signal $F_{REF}$ via software such as an operating system or an application or via hardware such as a memory or a register.

The pair of test signals (D1 and D2) includes first and second test signals D1 and D2. The frequency of the first test signal D1 may be lower or higher than the frequency of the oscillation signal $F_{DCO}$ (also referred to herein as the oscillation signal frequency) by as much as a first frequency, and the frequency of the second test signal D2 may be higher or lower than the frequency of the oscillation signal $F_{DCO}$ by as much as the first frequency. The first and second test signals D1 and D2 will be described later in detail with reference to FIG. 4.

The LGC 110 may receive one or more parameters (A, B, and R), which are used to compensate for the influence of the PVT variations on the DCO 14, for example, from outside the semiconductor device 1. For example, the LGC 110 may receive the one or more parameters (A, B, and R) via software such as an operating system or an application or via hardware such as a memory or a register.

Since the semiconductor device 1 may be operated by receiving the one or more parameters (A, B, and R) as user-set values, the oscillation signal FDCO may be tuned in any desired manner, and the loop gain and loop bandwidth of the semiconductor device 1 may be stabilized.

The multiplier circuit 120 outputs the third digital signal DCW by multiplying the second digital signal, which is output by the DLF 12, by the multiplication coefficient β, to compensate for the decrease of the gain $K_{DCO}$ due to the PVT variations.

The multiplier circuit 120 may be controlled by a control signal CTL of the LGC 110.

The calibration circuit 100 will be described later in detail with reference to FIGS. 2 and 3.

The influence of PVT variations on the TDC 10 may be addressed by allowing the TDC 10 to use a delay chain 142 of the DCO 14, and this will be described later in detail with reference to FIG. 5.

The semiconductor device 1 may further include an automatic frequency calibrator (AFC) 20. According to some example embodiments, operations described herein as being performed by the AFC 20 may be performed by at least one processor executing program code that includes instructions corresponding to the operations. The instructions may be stored in a memory. The term 'processor,' as used in the present disclosure, may refer to, for example, a hardware-implemented data processing device having circuitry that is physically structured to execute desired operations including, for example, operations represented as code and/or instructions included in a program. In at least some example embodiments the above-referenced hardware-implemented data processing device may include, but is not limited to, a microprocessor, a central processing unit (CPU), a processor core, a multi-core processor; a multi-processor, an ASIC and an FPGA.

The AFC 20 is used to perform coarse calibration to calibrate the frequency of the oscillation signal $F_{DCO}$, which is output by the DCO 14, to fall within a similar frequency range to, or the same frequency as, a desired frequency. The AFC 20 may calibrate the frequency of the oscillation signal $F_{DCO}$ using, for example, a binary search algorithm. The AFC 20 may provide an output signal $D_{AFC}$ to the DCO 14 based on the calibration of the frequency of the oscillation signal $F_{DCO}$. The operation of the AFC 20 will be described later in detail with reference to FIG. 4. According to some example embodiments, the AFC 20 may receive the reference frequency signal $F_{REF}$ via software such as an operating system or an application or via hardware such as a memory or a register. The AFC 20 may receive the feedback frequency signal $F_{FEED}$ from the first divider circuit 16.

Figure 2:
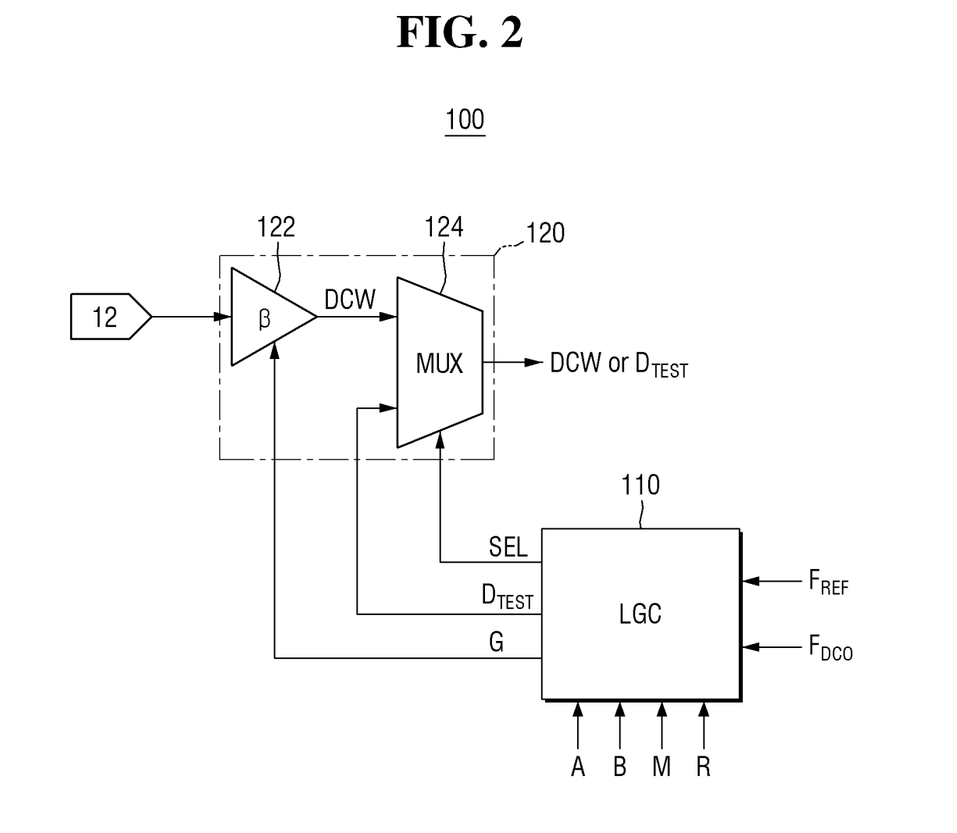
FIG. 2 is a block diagram of a calibration circuit of the semiconductor device according to some example embodiments.

FIG. 2 is a block diagram of a calibration circuit of the semiconductor device according to some example embodiments.

Referring to FIG. 2, the calibration circuit 100 may include the LGC 110 and the multiplier circuit 120, and the multiplier circuit 120 may include a multiplier 122 and a multiplexer 124. According to some example embodiments, the calibration circuit 100 of FIG. 2 may be similar to or the same as the calibration circuit 100 of FIG. 1. Repeated descriptions already given above with reference to FIG. 1 will be omitted. According to some example embodiments, operations described herein as being performed by any or all of the multiplier 122 and the multiplexer 124 may be performed by circuitry, such as an ASIC and/or an FPGA.

The multiplier 122 may output the third digital signal DCW by multiplying the second digital signal, which is output by the DLF 12, by the multiplication coefficient β. The multiplication coefficient β may be appropriately set so that any decrease in the gain $K_{DCO}$ of the DCO 14, resulting from PVT variations, may be compensated for under the control of a multiplication coefficient setting signal G provided by the LGC 110 (depicted in FIG. 1 as "CTL").

The multiplexer 124 may selectively provide the third digital signal DCW, which is output by the multiplier 122, and the final test signal $D_{TEST}$, which is generated by the LGC 110, to the DCO 14 under the control of a selection signal SEL provided by the LGC 110.

Figure 3:
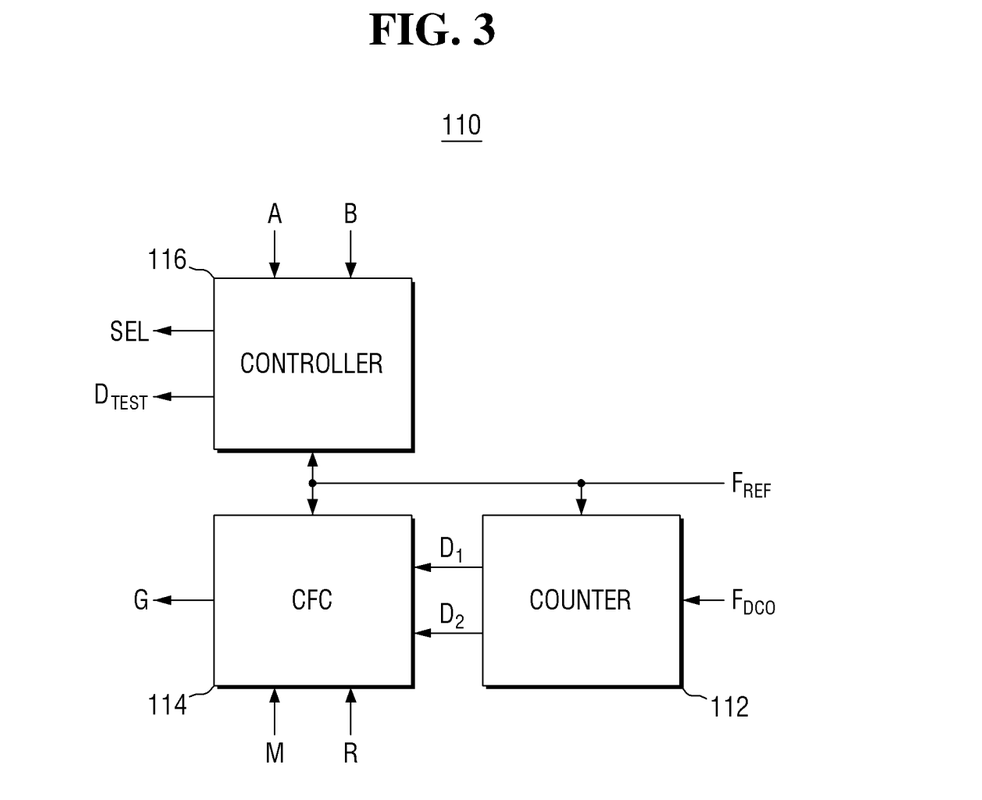
FIG. 3 is a block diagram of a loop gain calibrator (LGC) of the semiconductor device according to some example embodiments.

FIG. 3 is a block diagram of an LGC of the semiconductor device according to some example embodiments.

Referring to FIG. 3, the LGC 110 of the semiconductor device 1 includes a counter 112, a compensation factor calculator (CFC) 114, and a controller 116. According to some example embodiments, the LGC 110 of FIG. 3 may be similar to or the same as the LGC 110 of FIGS. 1-2. Repeated descriptions already given above with reference to FIG. 1 will be omitted. According to some example embodiments, operations described herein as being performed by any or all of the counter 112 and the CFC 114 may be performed by circuitry, such as an ASIC and/or an FPGA.

The counter 112 receives the oscillation signal $F_{DCO}$ and generates the pair of test signals (D1 and D2). The generation of the pair of test signals is discussed in further detail in association with FIG. 4 below.

The CFC 114 receives the pair of test signals (D1 and D2), output by the counter 112, and generates the multiplication coefficient setting signal G, which is output to the multiplier 122 of the multiplier circuit 120 for setting the multiplication coefficient β of the multiplier 122.

As discussed further in association with FIG. 4 below, the CFC 114 may receive a third parameter R and the first division ratio M, which is used to determine the ratio of the frequency of the oscillation signal $F_{DCO}$ and the gain $K_{DCO}$ of the DCO 14, and may generate the multiplication coefficient setting signal G based on the third parameter R and the first division ratio M.

The controller 116 may receive a first parameter A, which is used to determine the frequencies of the pair of test signals (D1 and D2), and a second parameter B, which is used to determine the output durations of the pair of test signals (D1 and D2). The controller 116 may output the final test signal $D_{TEST}$, which is generated based on the first and second parameters A and B. The controller 116 may also output the selection signal SEL to the multiplexer 124 of the multiplier circuit 120 to control the multiplexer 124 to switch between outputting the third digital signal DCW and outputting the final test signal $D_{TEST}$.

The counter 112, the CFC 114, and the controller 116 may be driven by the reference frequency signal $F_{REF}$.

The CFC 114 may receive the third parameter R, which is used to determine the ratio of the frequency of the oscillation signal $F_{DCO}$ and the gain $K_{DCO}$ of the DCO 14, for example, from outside the semiconductor device 1. For example, the CFC 114 may receive the third parameter R via software such as an operating system or an application or via hardware such as a memory or a register.

Similarly, the controller 116 may receive the first parameter A, which is used to determine the frequencies of the pair of test signals (D1 and D2), and the second parameter B, which is used to determine the output durations of the pair of test signals (D1 and D2), for example, from outside the semiconductor device 1. For example, the controller 116 may receive the first and second parameters A and B via software such as an operating system or an application or via hardware such as a memory or a register.

A method of operating the semiconductor device 1 according to some example embodiments will hereinafter be described with reference to FIG. 4.

Figure 4:
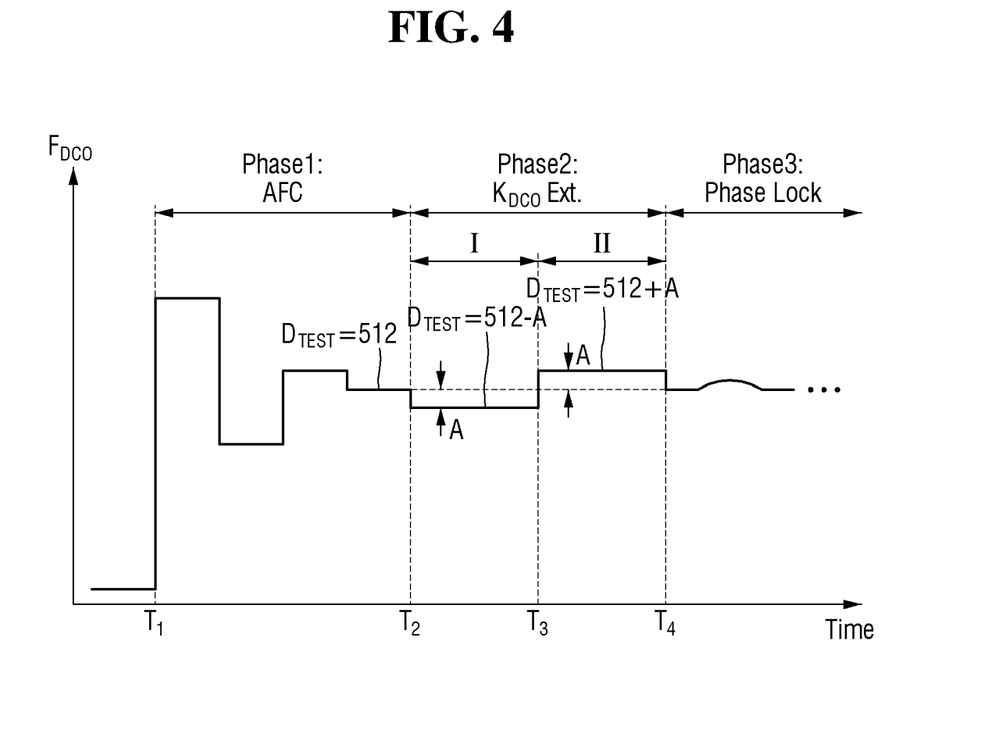
FIG. 4 is a graph for explaining a method of operating a semiconductor device according to some example embodiments.

FIG. 4 is a graph for explaining a method of operating a semiconductor device according to some example embodiments.

Referring to FIGS. 1 through 4, the operation of the semiconductor device 1 may be divided into three phases, e.g., Phase 1, Phase 2, and Phase 3.

In Phase 1, the semiconductor device 1 generates a first output signal by performing a first calibration operation on the frequency of the oscillation signal $F_{DCO}$ of the DCO 14 using the LGC 110 and the AFC 20.

In Phase 1 where the LGC 110 is driven, the multiplexer 124 may be set to apply the final test signal $D_{TEST}$, instead of the output of the DLF 12, to the DCO 14 under the control of the selection signal SEL.

Thereafter, the semiconductor device 1 may perform the first calibration operation (e.g., a coarse calibration operation) using the AFC 20 to calibrate the frequency of the oscillation signal $F_{DCO}$ to quickly fall within a frequency range similar to or the same as a desired frequency. The AFC 20 may calibrate the frequency of the oscillation signal $F_{DCO}$, which is generated by the DCO 14, using, for example, a binary search algorithm.

The final test signal $D_{TEST}$ may be set to half of an upper limit value of the second digital signal, which is output by the DLF 12. For example, in a case where the second digital signal consists of 10 bits, the final test signal $D_{TEST}$ may be set to half of the upper limit value of the second digital signal, e.g., 512 (=1024/2).

In Phase 2, the semiconductor device 1 extracts the gain $K_{DCO}$ of the DCO 14 using the LGC 110. In Phase 2, the AFC 20 may be turned off.

In Phase 2, the oscillation signal $F_{DCO}$ may be output as the first and second test signals D1 and D2.

The frequency of the first test signal D1 may be set to be lower or higher than the frequency of the first output signal, e.g., the frequency of the oscillation signal $F_{DCO}$, which is finally output from the Phase 1, by as much as the first frequency. On the other hand, the frequency of the second test signal D2 may be set to be higher or lower than the frequency of the first output signal, e.g., the frequency of the oscillation signal FDCO, which is finally output from the Phase 1, by as much as the first frequency.

For example, in a case where the second digital signal, which is output by the DLF 12, consists of 10 bits, the first test signal D1 may be output while being maintained at a frequency of (512−A) during as long a cycle of the reference frequency signal $F_{REF}$ as B in the section I, and the second test signal D2 may be output while being maintained at a frequency of (512+A) for during as long a cycle of the reference frequency signal $F_{REF}$ as B in the section II. Here, A and B denote the first and second parameters, respectively, which are used to determine the frequencies and the output durations of the first and second test signals D1 and D2.

However, some example embodiments are not limited thereto, unlike what is shown in FIG. 4, the first test signal D1 may be output while being maintained at the frequency of (512+A) during as long a cycle of the reference frequency signal $F_{REF}$ as B in the section I, and the second test signal D2 may be output while being maintained at the frequency of (512−A) for during as long a cycle of the reference frequency signal $F_{REF}$ as B in the section II.

A count D1 of rising edges of the first test signal D1, which is applied to the DCO 14 while being maintained at the frequency of (512−A) for during as long a cycle of the reference frequency signal $F_{REF}$ as B, and a count D2 of rising edges of the second test signal D2, which is applied to the DCO 14 while being maintained at the frequency of (512+A) for during as long a cycle of the reference frequency signal $F_{REF}$ as B, may be represented by the following equations:

$$D_1 = \frac{F_{DCO}}{F_{REF}/B} = \frac{F_{Fr} + (512 - A) \cdot K_{DCO}}{F_{REF}/B}$$

$$D_2 = \frac{F_{DCO}}{F_{REF}/B} = \frac{F_{Fr} + (512 + A) \cdot K_{DCO}}{F_{REF}/B}$$

$$D_X = D_2 - D_1 = \frac{2A \cdot K_{DCO}}{F_{REF}/B}$$

where $F_{DCO}$ denotes the oscillation signal output by the DCO 14, $F_{REF}$ denotes the frequency of the reference frequency signal, B denotes the second parameter, $F_{Fr}$ denotes the free running frequency of the DCO 14, A denotes the first parameter, and $K_{DCO}$ is the gain of the DCO 14.

As shown in the above equations, the gain $K_{DCO}$ of the DCO 14 may be identified by a digital value $D_X$, and as a result, a variation in the gain $K_{DCO}$ of the DCO 14, resulting from PVT variations, may also be identified. Accordingly, the loop gain of the semiconductor device 1 may be uniformly maintained by compensating for a decrease in the gain $K_{DCO}$ of the DCO 14 using the multiplier 122 of the multiplier circuit 120.

As already mentioned above, the LGC 110 determines the multiplication coefficient β of the multiplier 122 using the pair of test signals (D1 and D2). In a case where the third parameter R, e.g., $F_{DCO}/K_{DCO}$, which is for determining the ratio of the frequency of the oscillation signal $F_{DCO}$ and the gain $K_{DCO}$ of the DCO 14, is set to, for example, 1024, the multiplication coefficient β may be represented by the following equation:

$$\beta = \frac{F_{DCO}}{K_{DCO}} \bigg/ 1024 = \frac{M \cdot F_{REF}}{\frac{D_X \cdot F_{REF}}{2 \cdot A \cdot B}} \cdot \frac{1}{1024} = \frac{2 \cdot A \cdot B \cdot M}{D_X} \cdot \frac{1}{1024}$$

Since the first and second parameters A and B and the first division ratio M are user-set values and the digital value $D_X$ is a value deduced from the counts D1 and D2, a variation in the gain $K_{DCO}$ of the DCO 14, resulting from PVT variations, may be compensated for and the loop gain of the semiconductor device 1 may be appropriately controlled.

Thereafter, the semiconductor device 1 may perform a second calibration operation on the frequency of the oscillation signal $F_{DCO}$ by applying the final test signal $D_{TEST}$ to the DCO 14.

In Phase 3, the LGC 110 is turned off, and phase locking is performed. As a result, a final oscillation signal $F_{OUT}$ is output.

In this manner, if the gain $K_{DCO}$ of the DCO 14 decreases due to PVT variations, the LGC 110 may compensate for the decrease in the gain $K_{DCO}$ of the DCO 14 using the multiplier circuit 120 and may thus allow the loop gain of the semiconductor device 1 to be uniformly maintained. As a result, the bandwidth of the semiconductor device 1 may also be uniformly maintained, and the yield of the semiconductor device 1 may be raised.

In addition, since the one or more parameters (A, B, and R), which are used for the operation of the LGC 110, are provided from outside the semiconductor device 1 as user-set values, the oscillation signal $F_{DCO}$ may be tuned in any desired manner, and the loop gain and the loop bandwidth of the semiconductor device 1 may be stabilized.

Figure 5:
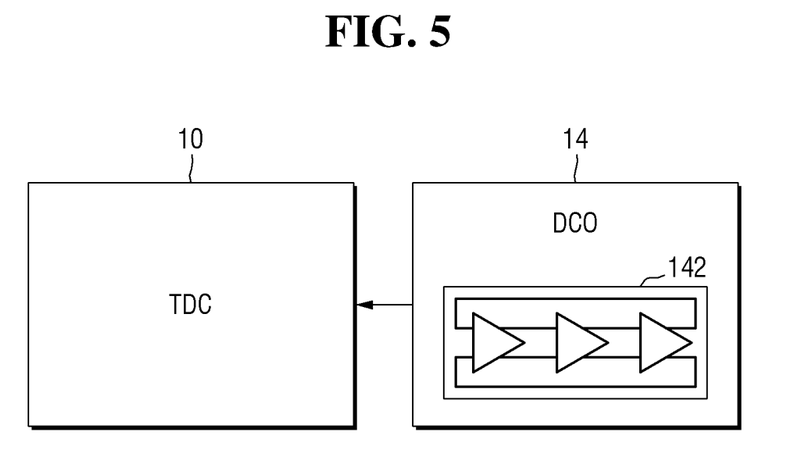
FIG. 5 is a block diagram of an example time-to-digital converter (TDC) of the semiconductor device according to some example embodiments.

FIG. 5 is a block diagram of an example TDC of the semiconductor device according to some example embodiments.

Referring to FIG. 5, in order to overcome the influence of PVT variations, the TDC 10 may be allowed to use the delay chain 142 of the DCO 14 because PVT variations are generally caused by the delay chain 142, which is formed by, for example, a plurality of inverters. According to some example embodiments, the TDC 10 and the DCO 14 of FIG. 5 may be similar to or the same as the TDC 10 and the DCO 14 of FIG. 1. Repeated descriptions already given above with reference to FIG. 1 will be omitted.

However, the influence of PVT variations on the TDC 10 may be addressed in various manners other than that set forth herein, and a TDC 10 having an arbitrary structure that may reduce or exclude the influence of PVT variations may be used.

In a case where the TDC 10 of FIG. 5 is employed, the loop gain T(s) of the semiconductor device 1, which is modeled from an s-domain, may be represented by the following equation:

$$T(s) = \frac{1}{2\pi} \cdot \frac{T_{REF}}{\Delta_{TDC}} \cdot \frac{K_{DCO}}{s} \cdot \beta \cdot \frac{1}{M+\alpha} \cdot H_{DLF}(s) =$$

$$\frac{1}{2\pi} \cdot \underbrace{\frac{T_{REF}}{\frac{1}{F_{DCO}}}}_{6} \cdot \frac{K_{DCO}}{s} \cdot \underbrace{\frac{2 \cdot A \cdot B \cdot M}{2A \cdot K_{DCO}}}_{\frac{F_{REF}}{B}} \cdot \frac{1}{1024} \cdot \frac{1}{M+\alpha} \cdot H_{DLF}(s) =$$

$$\frac{6}{2\pi} \cdot \frac{1}{s} \cdot F_{REF} \cdot H_{DLF}(s)$$

In the above equation, the number 6 indicates that the DCO 14 is implemented as a 3-stage DCO and the output signal of the DCO 14 has 6 phases. On the other hand, if the DCO 14 is implemented as a 4-stage DCO, the output signal of the DCO 14 may have 8 phases, and thus, the number 6 in the above equation may be replaced with the number 8.

As shown in the above equation, the loop gain T(s) of the semiconductor device 1 is dependent only upon the frequency of the reference frequency signal $F_{REF}$ and the characteristic equation $H_{DLF}(s)$ of the DLF 12. Thus, it is apparent that the influence of PVT variations on the loop gain of the semiconductor device 1 is reduced or excluded.

Figure 6:
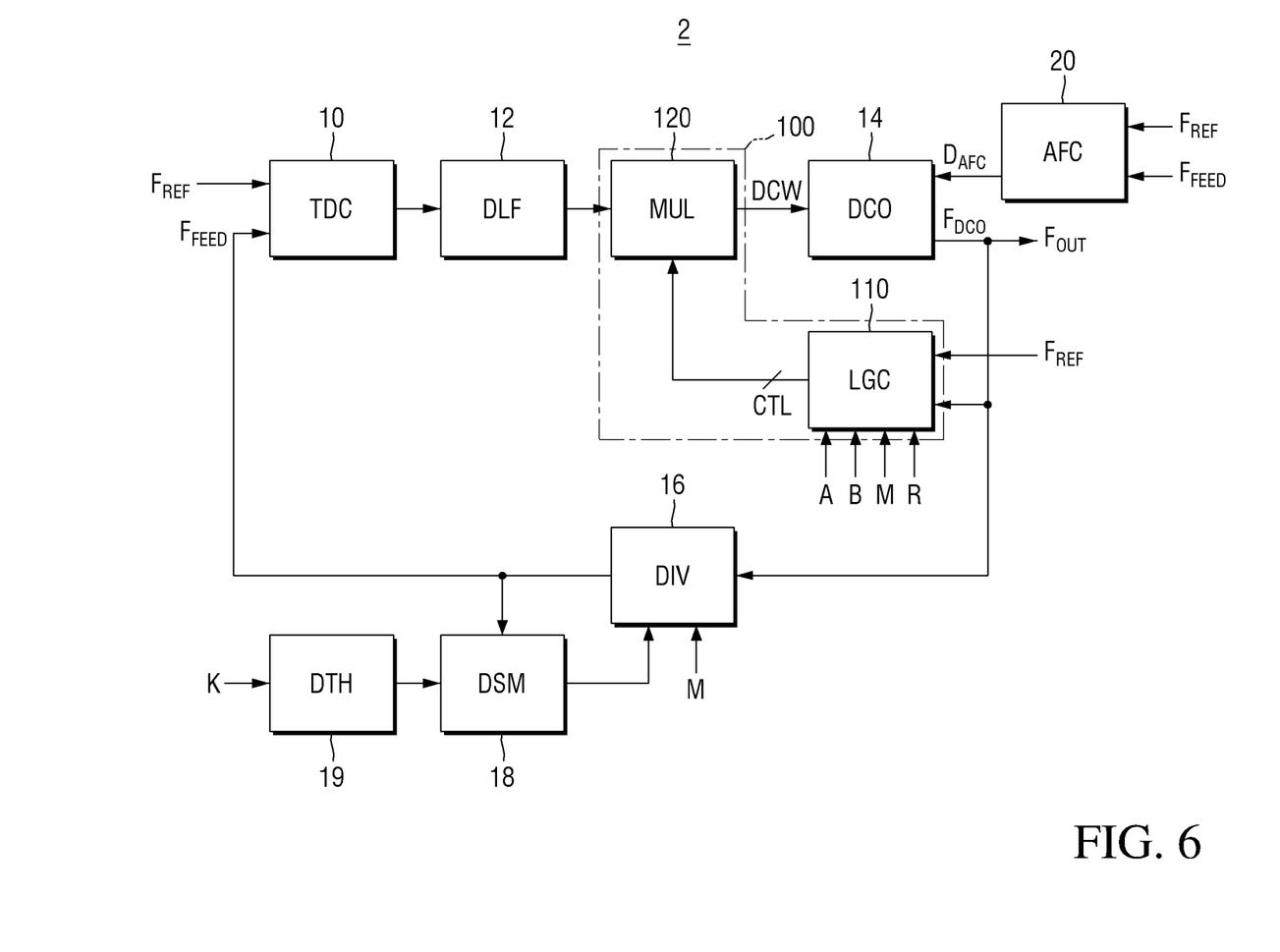
FIG. 6 is a block diagram of a semiconductor device including a dithering circuit according to some example embodiments.

FIG. 6 is a block diagram of a semiconductor device including a dithering circuit according to some example embodiments.

Referring to FIG. 6, a semiconductor device 2 may be similar to or the same as the semiconductor device 1 of FIG. 1, and may further include a dithering circuit 19. Repeated descriptions already given above with reference to FIG. 1 will be omitted. According to some example embodiments, operations described herein as being performed by the dithering circuit 19 may be performed by circuitry, such as an application-specific integrated circuit (ASIC) and/or a field programmable gate array (FPGA).

The dithering circuit 19 may perform dithering on an oscillation signal $F_{DCO}$ by controlling first and second divider circuits 16 and 18. That is, a spread spectrum clock generation (SSCG) that dithers the oscillation signal $F_{DCO}$ by modulating a division ratio K, which is input to the dithering circuit 19, into the form of a sawtooth wave may be realized.

In general, in the case of realizing the SSCG, a dithering profile is affected by PVT variations, and as a result, the bandwidth may be reduced. Then, a modulation profile is low-pass-filtered, and the modulation ratio, which is the peak-to-peak value of the dithering profile, may be reduced.

However, in the case of realizing the semiconductor device 2, which includes the dithering circuit 19, the influence of PVT variations on the dithering profile may be reduced or excluded, and as a result, a uniform modulation profile may be obtained.

Figure 7:
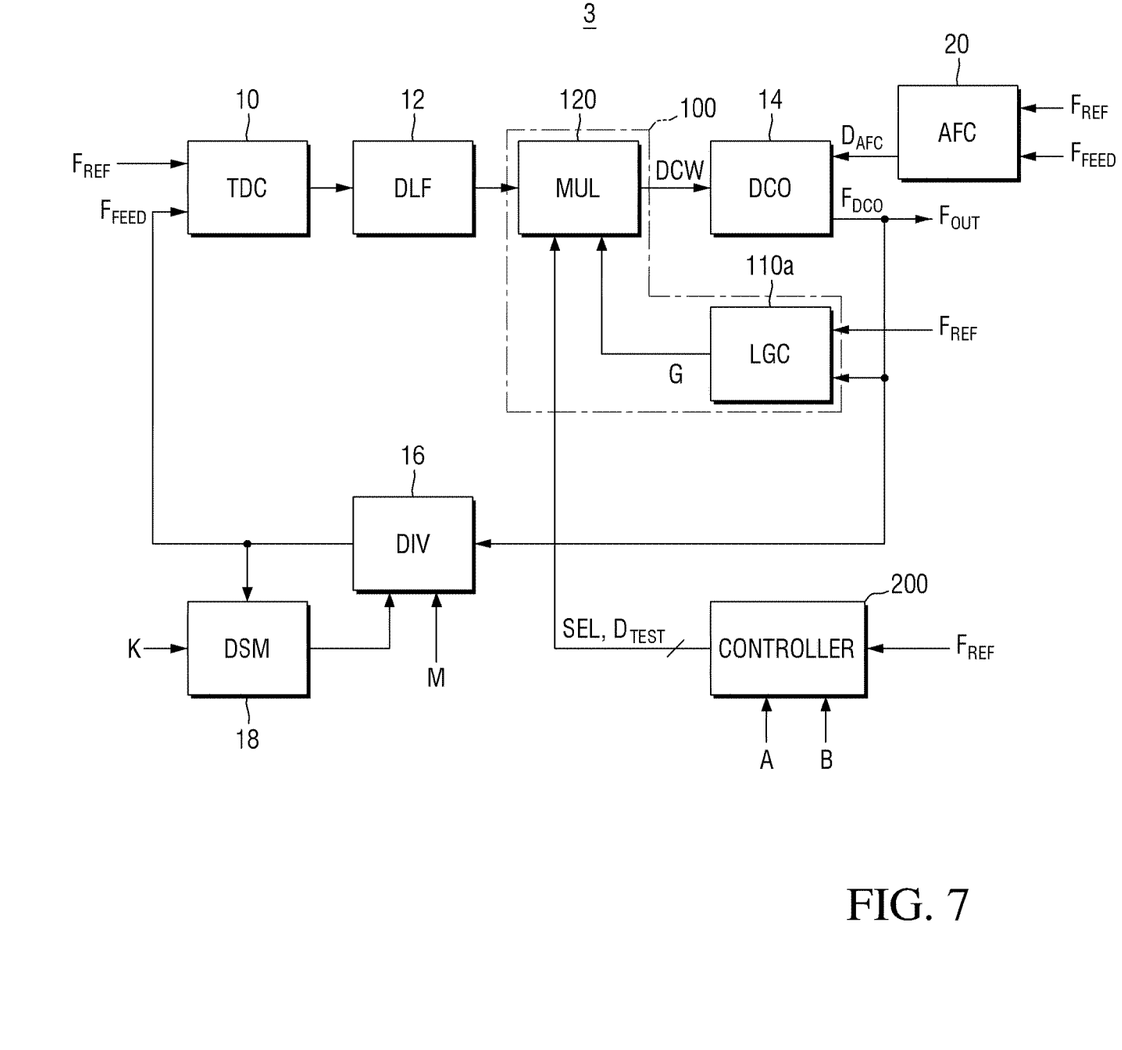
FIG. 7 is a block diagram of a semiconductor device including a controller external to the LGC according to some example embodiments.
Figure 8:
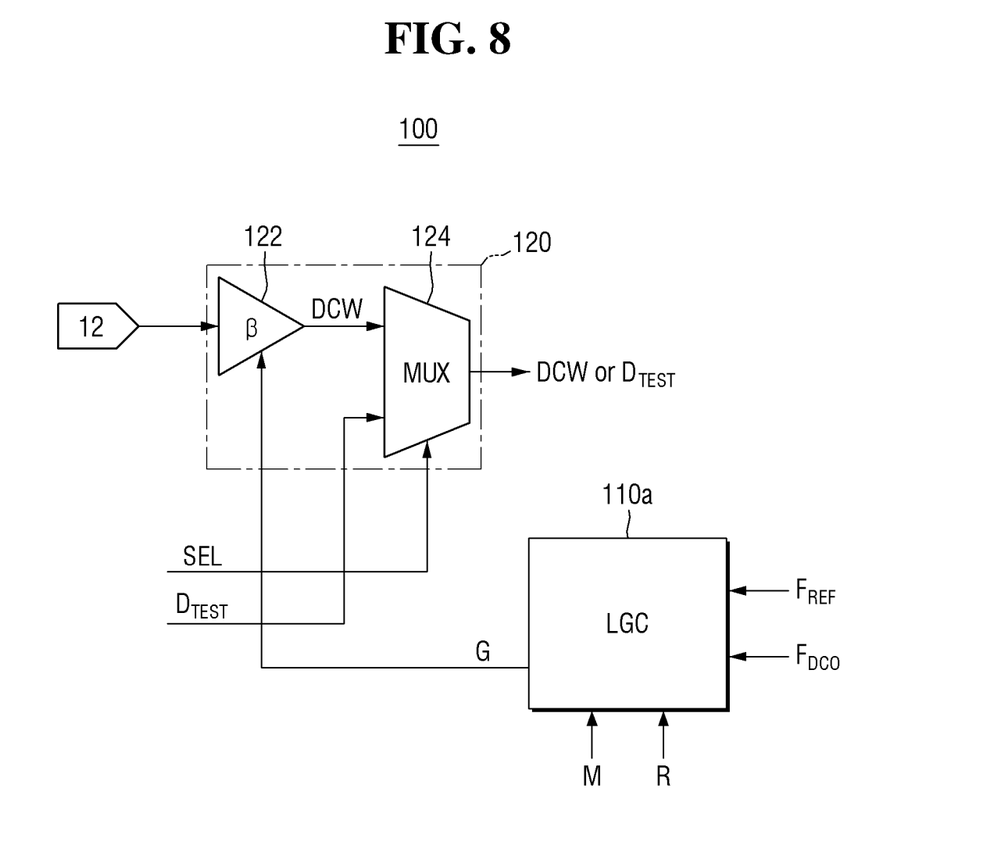
FIG. 8 is a block diagram of a calibration circuit of the semiconductor device including the controller external to the LGC according to some example embodiments.
Figure 9:
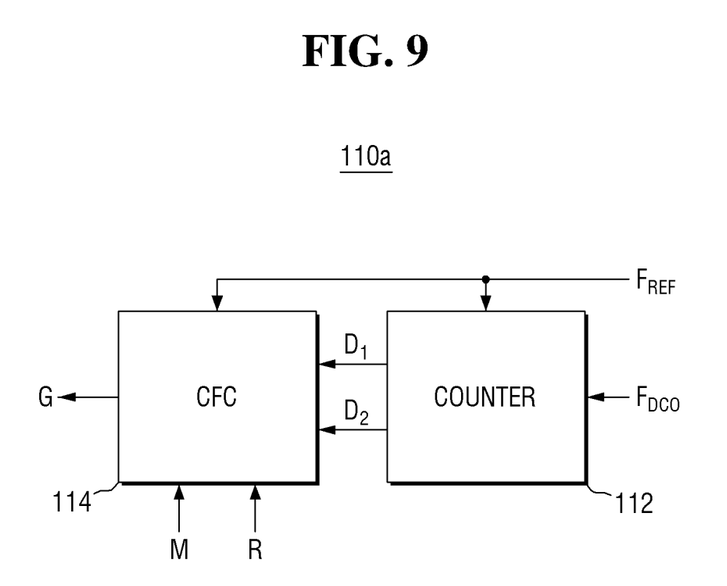
FIG. 9 is a block diagram of an LGC of the semiconductor device including the controller external to the LGC according to some example embodiments.

FIG. 7 is a block diagram of a semiconductor device including a controller external to the LGC according to some example embodiments, FIG. 8 is a block diagram of a calibration circuit of the semiconductor device including the controller external to the LGC according to some example embodiments, and FIG. 9 is a block diagram of an LGC of the semiconductor device including the controller external to the LGC according to some example embodiments.

Referring first to FIG. 9, an LGC 110a of a semiconductor device 3 includes a counter 112 and a CFC 114, but, unlike the LGC 110 of FIG. 3, does not include the controller 116 of FIG. 3.

Referring to FIGS. 7 and 8, a calibration circuit 100 of the semiconductor device 3 includes the LGC 110a and a multiplier circuit 120. In some example embodiments, a multiplexer 124 selectively provides one of a third digital signal DCW, which is output by a multiplier 122, and a final test signal $D_{TEST}$, which is generated by a controller 200, to a DCO 14 under the control of a selection signal SEL, which is provided by the controller 200.

A multiplication coefficient β of the multiplier 122 may be appropriately set to compensate for a decrease in a gain $K_{DCO}$ of the DCO 14, resulting from PVT variations, under the control of a multiplication coefficient setting signal G, which is provided by the LGC 110a.

In short, referring to FIGS. 7-9, the semiconductor device 3 differs from the semiconductor device 1 in that the controller 116 of the LGC 110 of FIG. 3 is implemented as the controller 200 on the exterior of the LGC 110a.

That is, the controller 200 may be implemented on the exterior of the LGC 110a, or even on the exterior of the semiconductor device 3, depending on an application of the semiconductor device 3.

Figure 10:
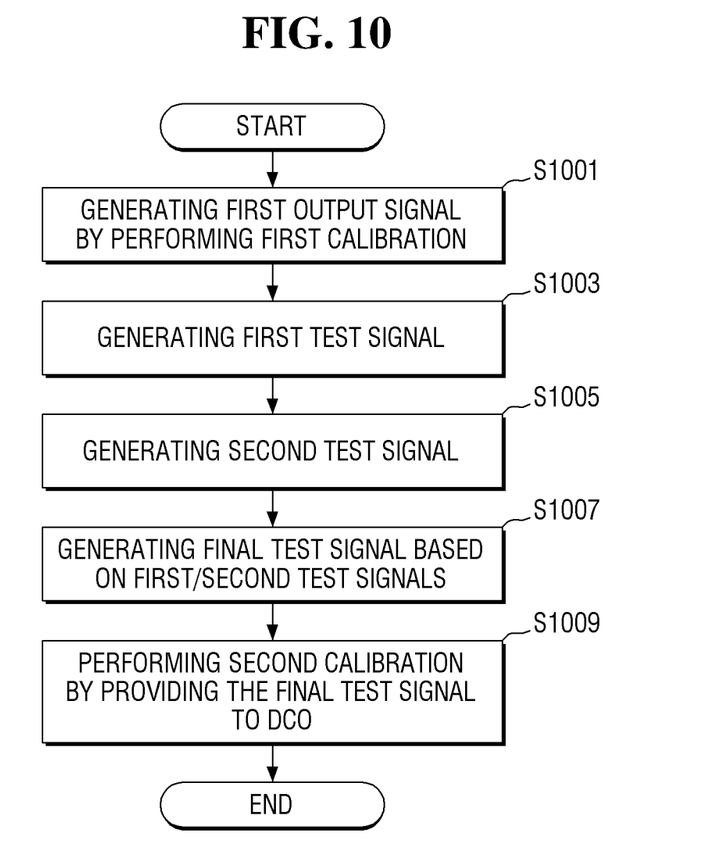
FIG. 10 is a flow chart a method of calibrating a digital-controlled oscillator (DCO) to compensate for process-voltage-temperature (PVT) variations according to some example embodiments.

FIG. 10 is a flow chart a method of calibrating a digital-controlled oscillator (DCO) to compensate for process-voltage-temperature (PVT) variations according to some example embodiments. According to some example embodiments, the method of FIG. 10 is performed by a semiconductor device similar to or the same as the semiconductor device 1 of FIG. 1, semiconductor device 2 of FIG. 6, or semiconductor 3 of FIG. 7.

Referring to FIG. 10, in operation S1001, a first output signal is generated by performing a first calibration operation on an oscillation signal of a digital-controlled oscillator (DCO). The oscillation signal has an oscillation frequency. According to some example embodiments, as discussed further in association with FIG. 1, the oscillation signal $F_{DCO}$ has a determined frequency based on a third digital signal DCW output by a multiplier circuit 120 of a calibration circuit 100. The multiplier circuit 120 may perform a multiplication operation on the second digital signal, which is output by the DLF 12, using a determined multiplication coefficient β. That is, the DCO 14 may generate the oscillation signal $F_{DCO}$ based on the third digital signal DCW, which is based on the second digital signal output from the DLF 12 that is passed through the multiplier circuit 120.

In operation S1003, a first test signal is generated. According to some example embodiments, the first test signal may have a frequency lower than a frequency of the first output signal by as much as a first frequency. The first test signal may be similar to or the same as the first test signal D1 discussed in association with FIG. 4.

In operation S1005, a second test signal is generated. According to some example embodiments, the second test signal may have a frequency higher than a frequency of the second output signal by as much as the first frequency. The second test signal may be similar to or the same as the second test signal D2 discussed in association with FIG. 4.

In operation S1007, a final test signal is generated based on the first test signal and the second test signal. According to some example embodiments, the final test signal is generated by performing a subtraction operation using the first test signal and the second test signal. The final test signal is discussed further in association with FIGS. 1-4 and 7-8.

In operation 1009, a second calibration is performed on the oscillation frequency by providing the final test signal to the DCO. According to some example embodiments, the second calibration is used to compensate for PVT variations. The second calibration is discussed further in association with FIG. 4.

According to some example embodiments, when the gain of a DCO decreases, the loop gain of a semiconductor device may be uniformly maintained, regardless of PVT variations, by compensating for the decrease in the gain of the DCO using a multiplier circuit. Accordingly, the bandwidth of a semiconductor device may be uniformly maintained, and the yield of a semiconductor device may be raised.

In addition, one or more parameters used for operating an LGC are provided from outside a semiconductor device as user-set values, an oscillation signal may be tuned in any desired manner, and the loop gain and the loop bandwidth of a semiconductor device may be stabilized.

Moreover, as already described above with reference to FIG. 6, in the case of realizing an SSCG, the influence of PVT variations on a dithering profile may be reduced or excluded, and as a result, a uniform modulation profile may be obtained.

In concluding the detailed description, those skilled in the art will appreciate that many variations and modifications may be made to some example embodiments without substantially departing from the scope of the claims provided below.

What is claimed is:

1. A semiconductor device comprising:
 a time-to-digital converter (TDC) configured to
  receive a reference frequency signal and a feedback frequency signal, and
  output a first digital signal indicating a time difference between the reference frequency signal and the feedback frequency signal;
 a digital loop filter (DLF) configured to output a second digital signal generated by filtering the first digital signal;
 a multiplier circuit configured to output one of a third digital signal and a final test signal, the third digital signal being generated by performing a multiplication operation on the second digital signal using a multiplication coefficient;
 a digital-controlled oscillator (DCO) configured to generate an oscillation signal having an oscillation signal frequency based on the output one of the third digital signal and the final test signal; and
 a loop gain calibrator (LGC) configured to
  receive the oscillation signal,
  generate a pair of test signals, and
  determine the multiplication coefficient using the pair of test signals.

2. The semiconductor device of claim 1, wherein
 the pair of test, signals include first and second test signals,
 a frequency of the first test signal is lower than the oscillation signal frequency by as much as a first frequency, and
 a frequency of the second test signal is higher than the oscillation signal frequency by as much as the first frequency.

3. The semiconductor device of claim 2, wherein the multiplier circuit includes a multiplexer configured to output the one of the third digital signal and the final test signal, the final test signal being generated from the pair of test signals to the DCO.

4. The semiconductor device of claim 1, wherein
the LGC is further configured to receive a first parameter and a second parameter, the first parameter being used to determine frequencies of the pair of test signals, the second parameter being used to determine output durations of the pair of test signals, and
the LGC includes a controller configured to output the final test signal to the multiplier circuit, the final test signal being generated based on the first and second parameters.

5. The semiconductor device of claim 1, wherein the LGC includes
a counter configured to
receive the oscillation signal, and
generate the pair of test signals, and
a compensation factor calculator (CFC) configured to
receive the pair of test signals, and
generate a multiplication coefficient setting signal for setting the multiplication coefficient.

6. The semiconductor device of claim 5, wherein the CFC is further configured to
receive a third parameter used to determine a ratio of the oscillation signal frequency and a gain of the DCO, and
generate the multiplication coefficient setting signal based on the third parameter.

7. The semiconductor device of claim 1, further comprising:
an automatic frequency calibrator (AFC) configured to calibrate the oscillation signal frequency using a binary search algorithm.

8. The semiconductor device of claim 1, further comprising:
a controller configured to
receive a first parameter and a second parameter, the first parameter being used to determine frequencies of the pair of test signals, the second parameter being used to determine output durations of the pair of test signals, and
output the final test signal generated based on the first and second parameters.

9. A semiconductor device comprising:
a time-to-digital converter (TDC) configured to
receive a reference frequency signal and a feedback frequency signal, and
output a first digital signal indicating a time difference between the reference frequency signal and the feedback frequency signal;
a digital loop filter (DLF) configured to output a second digital signal generated by filtering the first digital signal;
a multiplier circuit including
a multiplier configured to generate a third digital signal by performing a multiplication operation on the second digital signal using a multiplication coefficient, and
a multiplexer configured to selectively output one of the third digital signal and a final test signal to a digital-controlled oscillator (DCO);
the DCO configured to generate an oscillation signal having an oscillation signal frequency based on the output one of the third digital signal and the final test signal; and
an loop gain calibrator (LGC) configured to
receive the oscillation signal,
generate a pair of test signals, and
generate the final test signal using the pair of test signals.

10. The semiconductor device of claim 9, wherein
the pair of test signals include first and second test signals,
a frequency of the first test signal is lower than the oscillation signal frequency by as much as a first frequency, and
a frequency of the second test signal is higher than the oscillation signal frequency by as much as the first frequency.

11. The semiconductor device of claim 9, wherein the LGC is further configured to determine the multiplication coefficient using the pair of test signals.

12. The semiconductor device of claim 9, wherein
the LGC is further configured to receive a first parameter and a second parameter, the first parameter being used to determine frequencies of the pair of test signals, the second parameter being used to determine output durations of the pair of test signals, and
the LGC includes a controller configured to output the final test signal generated based on the first and second parameters.

13. The semiconductor device of claim 9, wherein the LGC includes
a counter configured to
receive the oscillation signal, and
generate the pair of test signals, and
a compensation factor calculator (CFC) configured to
receive the pair of test signals, and
generate a multiplication coefficient setting signal for setting the multiplication coefficient.

14. The semiconductor device of claim 13, wherein the CFC is further configured to
receive a third parameter used to determine a ratio of the oscillation signal frequency and a gain of the DCO, and
generate the multiplication coefficient setting signal based on the third parameter.

15. The semiconductor device of claim 9, further comprising:
an automatic frequency calibrator (AFC) configured to calibrate the oscillation signal frequency using a binary search algorithm.

16. The semiconductor device of claim 9, further comprising:
a controller configured to
receive a first parameter and a second parameter, is the first parameter being used to determine frequencies of the pair of test signals, and the second parameter being used to determine output durations of the pair of test signals, and
output the final test signal generated based on the first and second parameters.

* * * * *